(12) United States Patent
Fyfe

(10) Patent No.: US 6,771,038 B2
(45) Date of Patent: Aug. 3, 2004

(54) INSTRUMENT REFERENCE SYSTEM

(75) Inventor: David McIntyre Fyfe, Glen Iris (AU)

(73) Assignee: Australian Arrow Pty Ltd, Carrum Downs (AU)

(*) Notice: Subject to any disclaimer, the term of this patent is extended or adjusted under 35 U.S.C. 154(b) by 0 days.

(21) Appl. No.: 10/220,119

(22) PCT Filed: Feb. 27, 2001

(86) PCT No.: PCT/AU01/00211
§ 371 (c)(1),
(2), (4) Date: Nov. 12, 2002

(87) PCT Pub. No.: WO01/65569
PCT Pub. Date: Sep. 7, 2001

(65) Prior Publication Data
US 2003/0102838 A1 Jun. 5, 2003

(30) Foreign Application Priority Data
Feb. 29, 2000 (AU) .............................................. PQ5927

(51) Int. Cl.[7] .............................................. G05B 19/40
(52) U.S. Cl. ........................ 318/685; 318/696; 318/450; 116/DIG. 6; 116/DIG. 35; 116/62.1; 116/62.3; 116/62.4; 116/47; 116/28.1
(58) Field of Search ................................. 318/685, 696, 318/450; 116/DIG. 6, DIG. 35, 62.1, 62.3, 62.4, 47, 28.1

(56) References Cited

U.S. PATENT DOCUMENTS

| | | | | |
|---|---|---|---|---|
| 4,879,510 A | * | 11/1989 | Itoh | 324/150 |
| 5,001,930 A | * | 3/1991 | Glover et al. | 73/493 |
| 5,333,371 A | | 8/1994 | Mittenbühler et al. | |
| 5,665,897 A | | 9/1997 | Lippmann et al. | |
| 5,734,210 A | * | 3/1998 | Keutz | 310/49 R |
| 6,356,046 B1 | * | 3/2002 | Koumura et al. | 318/696 |
| 6,470,822 B2 | * | 10/2002 | Adams et al. | 116/284 |

FOREIGN PATENT DOCUMENTS

| | | |
|---|---|---|
| DE | 193 72 775 A1 | 3/1999 |
| JP | 091847-40 A | 7/1997 |
| SU | 845-235 A | 7/1981 |

* cited by examiner

Primary Examiner—Rina Duda
(74) Attorney, Agent, or Firm—Christensen O'Connor Johnson Kindess PLC

(57) ABSTRACT

A method and system for calibrating a motor-driven instrument pointer (8) against a stop (5) without using feedback includes, in a first power state, driving the pointer (8) at full torque against the stop (5), then driving the pointer (8) against the stop at a reduced torque for a predetermined radial distance so at the pointer (8) is caused to be held against the stop (5). A third driving step, at reduced torque for a further predetermined radial distance, may be used in a second power state to move the pointer (8) against the stop (5).

20 Claims, 3 Drawing Sheets

INSTRUMENT REFERENCE SYSTEM

TECHNICAL FIELD OF THE INVENTION

This invention relates to an instrument reference system and more particularly relates to a system for calibrating an instrument pointer driven by a motor against a mechanical stop without using feedback control. The invention will be described with reference to an automotive instrument by way of example only but it will be understood that the invention is not limited thereto.

BACKGROUND OF THE INVENTION

Calibration of a motor, such as a stepper motor, used in an instrument or equipment of the type used for automotive instrumentation, is important for correct operation of the instrument. Typically, an electronic-controlled instrumentation may take the form of a mechanical dial comprising a pointer driven by a stepper motor. To ensure proper function, the pointer location must be predictable. As is known from existing systems, an inexpensive way of achieving this, without using any form of feedback, is to incorporate a mechanical stop as part of the mechanism and to locate the pointer relative to this stop at "power on".

One known system for calibration of a stepper motor in automotive instrumentation provides that, at initial power up, the motor is driven at least a few degrees against the stop to ensure that it has made contact with the stop. To avoid jitter (small vibrations of the motor shaft) at the stop the frequency of the rotating magnetic field is increased quickly beyond that at which the motor can synchronise its movement with the field.

The drawback of this system, however, is that the jitter is most evident if the motor is already against the stop when the referencing procedure commences. Another drawback with this technique is that it relies on the pointer remaining against its mechanical stop once it has reached it. In practice it has been found that the pointer has a tendency to 'bounce' up to several degrees off the stop, especially when the motor has been moving at high speed when it hits the stop. Once this has occurred, the motor can not re-synchronise with the high frequency rotating field and remains stationary away from the reference position.

One possible solution to the 'bouncing' problem is to drive the motor and hence the pointer at a sufficiently low speed. This, however, is not desirable as it can take considerable time where the field must rotate for sufficient time to guarantee that the motor has reached the stop. In automotive instrumentation, this delay is particularly unsuitable.

SUMMARY OF THE INVENTION

It is therefore desirable to provide an improved calibration system for instrumentation, without using feedback control.

It is further desirable to provide a system with reduced jitter of the driving motor.

It is also desirable to provide a system which calibrates quickly and which can be produced at an economical cost.

According to one aspect of the invention there is provided a method of calibrating an electronically controlled, electric motor driven instrument comprising the steps of:
 a. connecting electrical power to the instrument,
 b. driving the motor at full torque for a first predetermined radial distance whereby the motor or a pointer driven thereby contacts a stop,
 c. driving the motor at a reduced torque for a second predetermined radial distance whereby the motor or pointer is caused to be held against the stop.

Preferably, the first predetermined radial distance is between 180° and 360°, more preferably between 240° and 350°.

Preferably, the second predetermined radial distance is between 1° and 90°, more preferably about 10°.

In one form of the invention, a two stage calibration is provided whereby the instrument is calibrated on initial connection to an electrical power source as described above, and then undergoes a second calibration when electrical circuits with which the instrument is associated are switched on. With this arrangement, the second calibration comprises the steps of:
 d. connecting the instrument to at least one electrical circuit for which the instrument is to be associated,
 e. driving the motor at a reduced torque for a third predetermined radial distance whereby the motor or pointer contacts the stop, and
 f. driving the motor at a reduced torque for said second predetermined radial distance to cause the motor or pointer to be held against the stop.

Preferably, the third predetermined radial distance is between 10° and 120°, more preferably about 90°.

According to another aspect of the invention there is provided a system for calibrating an instrument or equipment operated by an electric motor, such as a stepper motor, comprising:
 a pointer means engageable with said electric motor and adapted to be driven thereby,
 a stop means positioned at a desired reference point wherein,
 in a first powered state, the motor is accelerated at a maximum torque for a first predetermined radial distance to move said pointer towards a position whereat said stop is engaged,
 thereafter, said motor is re-accelerated at a reduced torque for a second predetermined radial distance whereby the pointer is caused to be moved and held against said stop.

In one form of the invention, a two stage calibration is provided whereby, after an initial calibration, which occurs as soon as the instrument is first connected to a power source, it then undergoes a second calibration when electrical circuits with which the instrument is associated are switched on. In accordance with this aspect of the invention, the system includes a second calibration comprising,
 in a second powered state in which the instrument is connected to at least one electrical circuit for which the instrument is to be associated, means for accelerating the motor at a reduced torque for a third predetermined radial distance whereby the motor or pointer driven thereby contacts the stop, and thereafter driving the motor at a reduced torque for said second predetermined radial distance to cause the motor or pointer to be held against the stop.

Preferably, the third predetermined radial distance is between 10° and 120°, more preferably about 90°.

By calibrating the motor in this way, the need for a feedback control is avoided and calibration is achieved inexpensively, quickly and without jitter in both powered states.

In a preferred form of the invention, the electric motor is a stepper motor as used in an automotive instrumentation, where for correct operation of the instrument, calibration of the stepper motor is required.

The first powered state is preferably when an automotive instrument is first connected to a power supply, such as a battery. The second powered state is preferably when an ignition circuit of a vehicle is switched on.

The calibration is preferably executed in the first powered state whenever a battery power connection is interrupted and then re-connected. The calibration is preferably executed in the second powered state every time the ignition is switched on.

Further, in the first powered state, at maximum torque, a maximum motor rotation speed maybe of the order of 440°/s and said first predetermined radial distance may be 350°.

At the reduced torque, the motor rotation speed is preferably up to a maximum of 165°/s and said second predetermined radial distance may be 10°.

In the second powered state, at the said reduced torque, the motor rotation speed is preferably up to a maximum of 165°/s and said third predetermined radial distance maybe 90°.

In the first and second powered states, the motor or the pointer preferably contacts the stop when the motor is first rotated and completed at the radial distance of up to 350° or 90°. The pointer may bounce off the stop upon completion of the rotation.

In practice, the pointer may be driven by an intermediate gear, contained within the motor housing which, in turn, is driven by a rotor of the motor. The pointer preferably contacts the stop and remains contacted or stationary against the stop once the motor has completed its second rotation at reduced torque, for 10° and/or when the reference position is reached.

The pointer means may further comprise a pointer gear and the stop may comprise a mechanical stop. The stop may be located within the motor housing and contacted by the rotor of the motor, or by a co-operating part on the motor shaft, output gear or even an intermediate gear. For simplicity of description, however, reference will be made herein to the pointer contacting a stop, but it will be understood that this reference is not limiting.

The processing means preferably comprises a microprocessor which processes and controls the motor operation during calibration and normal operation.

It will be understood that during calibration of the stepper motor, the rotation of the rotor of the motor is in the opposite direction to normal instrument operation.

In order that the invention is more readily understood, a preferred embodiment will now be described with reference to the drawings.

DESCRIPTION OF THE PREFERRED EMBODIMENT

The invention will be described with reference to an automotive instrumentation stepper motor driving a pointer that rotates about an axis. The instrumentation may be, for example, a speedometer of a vehicle, a Rev counter, a fuel gauge, or any other instrument or gauge.

Figure 1:
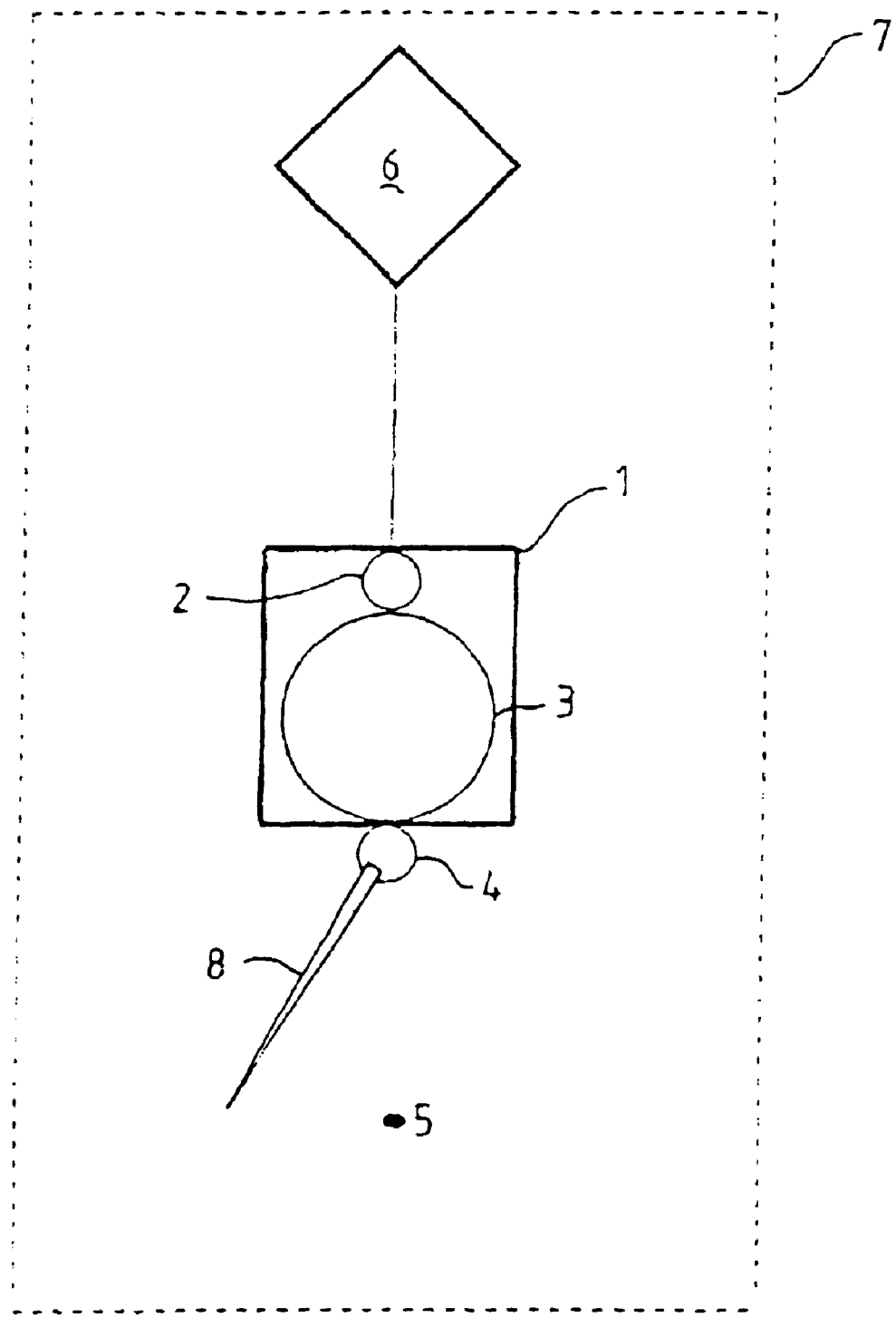
FIG. 1 is a schematic drawing of an instrument with a stepper motor embodying the invention.

The general layout of the instrument system is shown in FIG. 1. An electronically controlled instrumentation 7 comprises a stepper motor housing 1 having a rotor 2 and an intermediate gear 3. A pointer 8 with integral gear 4 is engaged with the intermediate gear 3 and is adapted to rotate about the axis of the integral gear 4. A mechanical stop 5 is positioned at a desired reference or zero point, and a microprocessor 6 provides control signals to the motor. While the stop 5 is shown as being contacted directly by the pointer 8, it will be understood that the stop may be provided in the motor housing 1 and contacted by the motor rotor 2 or a co-operating part driven thereby or by the intermediate gears.

Figure 2:
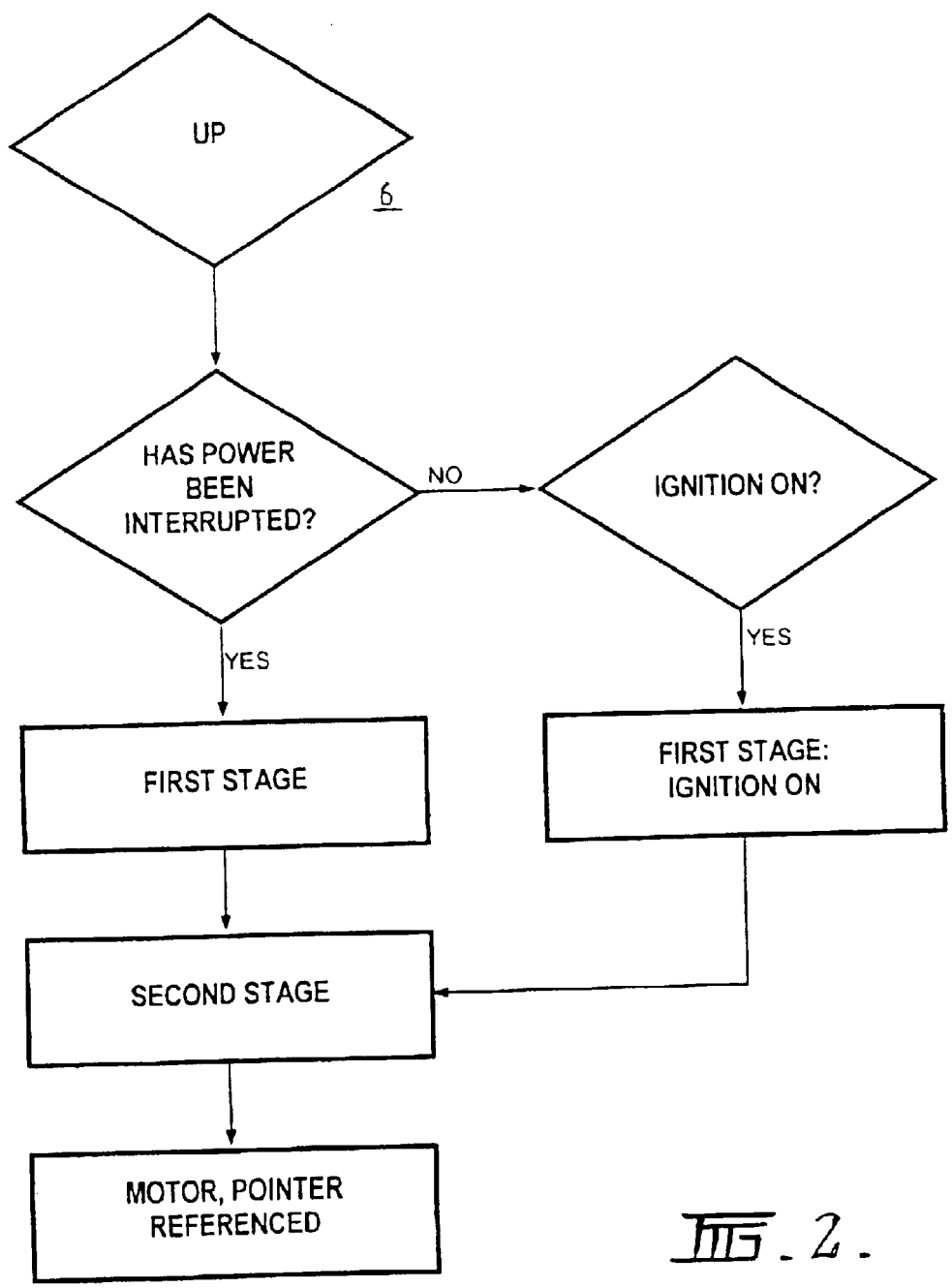
FIG. 2 is a process flow chart illustrating the calibration process of the stepper motor of FIG. 1 in accordance with one embodiment of the invention.

FIG. 2 shows the process flow chart by which the microprocessor 6 controls the calibration in accordance with the state of the power to the system and the position of an ignition switch which controls the electrical systems for which the instrument 7 is to be used.

Figure 3:
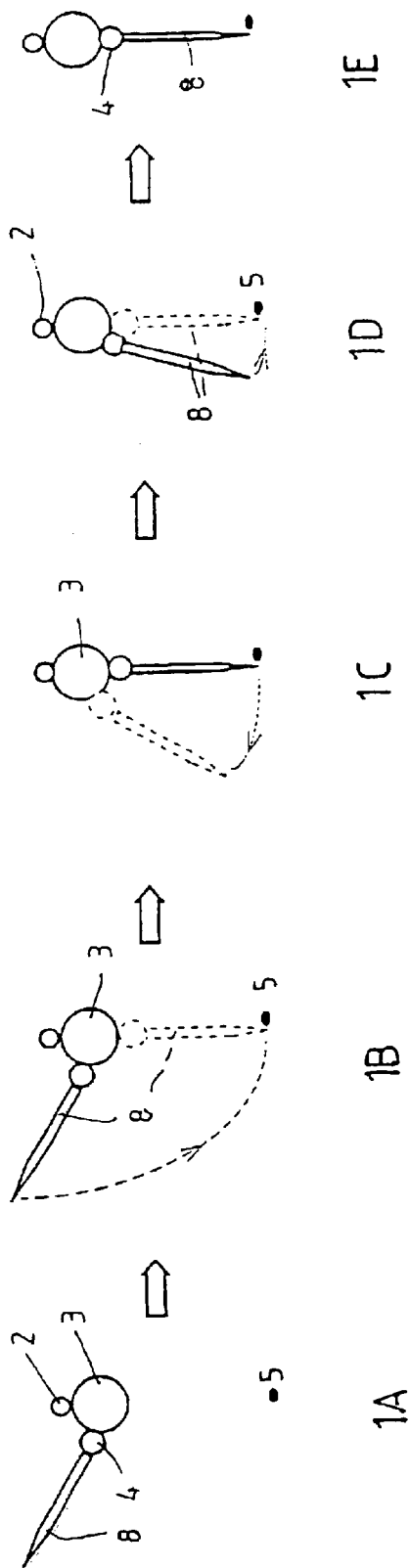
FIG. 3 is an illustrated sequence of the process flow of FIG. 2.
Figure 3:
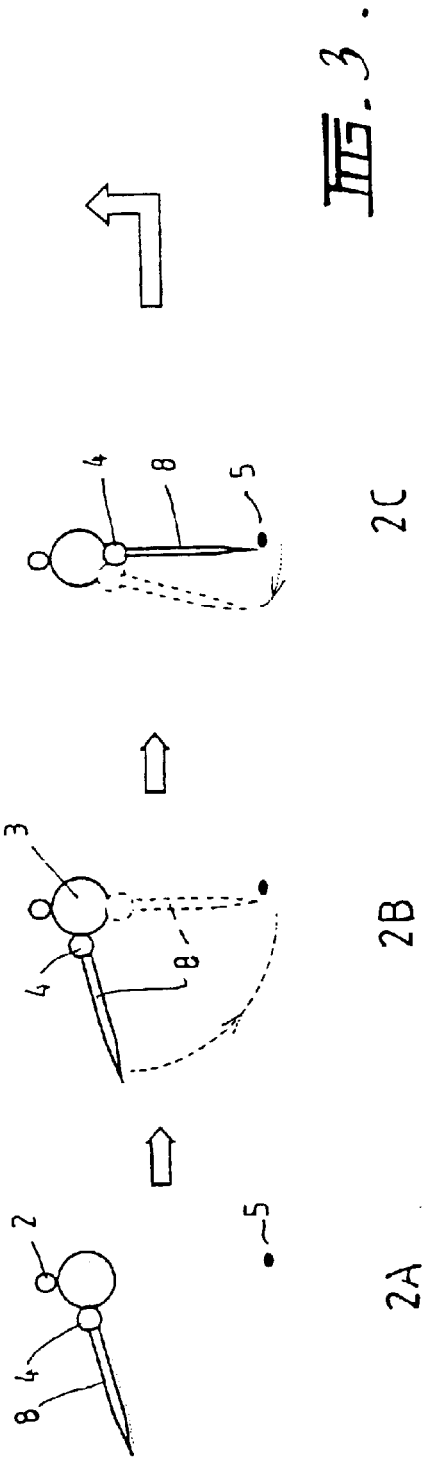

FIG. 3 illustrates the various calibration stages in accordance with the "power on" and "ignition on" parameters. These are as follows:

1A—Power connected first time—Start position
1B—First stage acceleration towards Stop 5.
1C—Bounce off Stop 5.
1D—Second stage acceleration
1E—Pointer positioned against Stop 5.
2A—Ignition on—Start position.
2B—Third stage acceleration.
2C—Bounce off Stop 5—leads to 1D.

Referring to FIGS. 2 and 3, an embodiment of the invention incorporates a microprocessor 6 which is programmed to calibrate the instrumentation when power is first connected to the instrument 7. In practice, this occurs when the battery is first connected in a vehicle or when it is replaced or when it is disconnected and re-connected. Effectively, it is the state where initial power is provided to the system. In the no-power state, there is no power to the instrument 7, the microprocessor 6 is off and the motor 1 has no current.

Once power is connected to the instrument 7, the microprocessor 6 assumes a low power standby mode and completes a logic check that determines that the power has been re-connected after a power interruption. If the logic determines a new power connection, the microprocessor 6 commences the calibration process in accordance with the logic program to commence a first stage calibration.

The microprocessor contains a pre-programmed series of commands forming an algorithm which is executable when initial conditions are satisfied. The process of programming the microprocessor will not be described as this will be known to a person skilled in this art.

In the first stage calibration, at commencement, it is assumed that the pointer 8 could be anywhere within the limits of its rotation. As shown in FIG. 3, in the start position 1A at "power on", the pointer is substantially away from the mechanical stop 5. (For simplicity, the microprocessor 6, instrument dial 7 and motor housing 1 are not shown in this drawing.)

The first stage calibration, shown at stage 1B, comprises accelerating the motor (rotor 2) at maximum torque and up to a maximum speed of 440°/s for a total distance of about 350°. The motor rotation is in the negative direction as compared to instrument operation, and it is assumed that the pointer 8 will probably bounce off the stop 5, as shown in position 1C in FIG. 3. To fully reference or zero the pointer 4 a second stage calibration 1D is executed. This time, the motor 2 is accelerated at a reduced torque and up to a maximum speed of about 165°/s for a total distance of about 10° in the negative direction. This acceleration results in a smaller referencing or zeroing movement at reduced torque to move the pointer against the stop 5 and to eliminate further bouncing off the stop 5. This movement also reduces jitter at the stop 5.

Once the second stage is complete, it is assumed that the pointer 8 is against its mechanical stop 5. Testing of this system has shown that the pointer, after the second stage, is referenced at the stop. The motor can now be operated in a normal state during which it can respond to input. Generally the motor will be operated with maximum torque.

In a second aspect of this embodiment, referencing of the instrument is required each time the vehicle ignition circuits are energized to ensure that the instrument pointer 8 is engaged against the stop 5, as it is possible for the pointer to move from the reference position during periods when the ignition circuits are "off". Typically, the ignition circuits are energized when a driver of a vehicle turns the ignition key to an "on" position. Generally, the microprocessor 6 and the instrument motor will be powered all the time the battery is connected, but, unless the battery circuit is interrupted by being disconnected, or a fuse is replaced, etc., no referencing program will be initiated. Hence, a second stage procedure is required to ensure the instrument is correctly calibrated whenever the ignition circuits are activated.

For the second stage calibration, it is assumed that the motor is generally less than 90° away from its zero point. As shown is FIG. 3, at position 2A, at the start position for "ignition on", the pointer 8 is less than 90° from stop 5. In practice, the pointer may have moved slightly off the stop due to a force being applied, such as a vibration, shaking etc. of the instrumentation while the ignition circuits are switched off. When the ignition is switched on, the microprocessor 6 logic verifies that the ignition is on, as indicated in FIG. 2.

The instrument motor is then accelerated at a reduced torque and up to a maximum speed of 160°/s for a total distance of 90° in the negative direction, as shown at position 2B in FIG. 3. Again, after this first acceleration, it is assumed that the pointer 8 has reached the stop 5 and has probably bounced off it 2C in FIG. 3. To fully reference or zero the motor, the second stage shown at position 1D is executed, this being the same second stage of the previous, "power on" procedure, where the motor is accelerated at reduced torque up to a maximum speed of 160°/s for a radial distance of 10°.

The embodiment described provides a system for calibration with reduced or no jitter in the motor, by using a two stage process. Further, calibration can be achieved quickly and inexpensively, as no feedback control is used and varying pointer dynamics can be reliably handled accommodating different degrees of the pointer 8 bouncing off the stop 5.

The invention has been described with reference to an instrument driven by a single stepper motor. It is to be understood, however, that a plurality of stepper motors can be simultaneously controlled and calibrated.

Further, since modifications within the spirit and scope of the invention may be readily effected by persons skilled in the art, it is to be understood that the invention is not limited to the particular embodiment described, by way of example, hereinabove, and any modifications which come within the scope of the invention shall be deemed to be within the ambit of the above description.

What is claimed is:
1. A method of calibrating an electronically controlled, electric motor driven instrument, comprising the steps of:
   (a) connecting electrical power to the instrument,
   (b) driving the motor at full torque for a first predetermined radial distance whereby the motor or a pointer driven thereby contacts a stop,
   (c) driving the motor at a reduced torque for a second predetermined radial distance whereby the motor or pointer is caused to be held against the stop.
2. A method according to claim 1, wherein the first predetermined radial distance is between 180° and 360°.
3. A method according to claim 2, wherein the first predetermined radial distance is between 240° and 350°.
4. A method according to any one of the preceding claims, wherein the second predetermined radial distance is between 1° and 90°.
5. A method according to claim 4, wherein the second predetermined radial distance is 10°.
6. A method according to claim 1, further comprising the steps of:
   (d) connecting the instrument to at least one electrical circuit for which the instrument is to be associated,
   (e) driving the motor at a reduced torque for a third predetermined radial distance whereby the motor or pointer contacts the stop, and
   (f) driving the motor at a reduced torque for said second predetermined radial distance to cause the motor or pointer to be held against the stop.
7. A method according to claim 6, wherein the third predetermined radial distance is between 10° and 120°.
8. A method according to claim 7, wherein the third predetermined radial distance is 90°.
9. A system for calibrating an instrument or equipment operated by an electric motor, such as a stepper motor, comprising:
   a pointer means engageable with said electric motor and adapted to be driven thereby,
   a stop means positioned at a desired reference point wherein,
   in a first powered state, the motor is accelerated at a maximum torque for a first predetermined radial distance to move said pointer towards a position whereat said stop is engaged,
   thereafter, said motor is re-accelerated at a reduced torque for a second predetermined radial distance whereby the pointer is caused to be moved and held against said stop.
10. A system according to claim 9, wherein in the first powered state, at maximum torque, a maximum motor rotation speed is 440°/s, and said first predetermined radial distance is 350°.
11. A system according to either of claims 9 or 10, wherein at the reduced torque, the motor rotation speed is up to a maximum of 165°/s and said second predetermined distance is 10°.
12. A system according to claim 9, further comprising:
   in a second powered state in which the instrument is connected to at least one electrical circuit for which the instrument is to be associated, means for accelerating the motor at a reduced torque for a third predetermined radial distance whereby the motor or pointer driven thereby contacts the stop, and thereafter driving the motor at a reduced torque for said second predetermined radial distance to cause the motor or pointer to be held against the stop.
13. A system according to claim 12, wherein the third predetermined radial distance is between 10° and 120°.
14. A system according to claim 13, wherein the third predetermined radial distance is 90°.

15. A system according to claim 12, wherein, in the second powered state, at the said reduced torque, the motor rotation speed is up to a maximum of 165°/s and said third predetermined radial distance is 90°.

16. A system according to claim 9, wherein, in the first and second powered states, the motor or the pointer contacts the step when the motor is first rotated and completed at the radial distance of up to 350° or 90°.

17. A system according to claim 9, wherein the first powered state is when an automotive instrument is first connected to a power supply, such as a battery.

18. A system according to claim 12, wherein the second powered state is when an ignition circuit of a vehicle is switched on.

19. A system according to claim 9, wherein the calibration is executed in the first powered state whenever the battery power connection is interrupted and then re-connected.

20. A system according to claim 12, wherein the calibration is executed in the second powered state every time an ignition circuit of a vehicle is switched on.

* * * * *